US012757448B2

(12) United States Patent
Wei et al.

(10) Patent No.: US 12,757,448 B2
(45) Date of Patent: Oct. 6, 2026

(54) GAN POWER DEVICE AND MANUFACTURING METHOD THEREOF

(71) Applicant: PEKING UNIVERSITY, Beijing (CN)

(72) Inventors: Jin Wei, Beijing (CN); Yanlin Wu, Beijing (CN); Junjie Yang, Beijing (CN); Maojun Wang, Beijing (CN); Bo Shen, Beijing (CN)

(73) Assignee: PEKING UNIVERSITY, Beijing (CN)

(*) Notice: Subject to any disclaimer, the term of this patent is extended or adjusted under 35 U.S.C. 154(b) by 371 days.

(21) Appl. No.: 18/505,458

(22) Filed: Nov. 9, 2023

(65) Prior Publication Data

US 2024/0079470 A1 Mar. 7, 2024

Related U.S. Application Data

(63) Continuation of application No. PCT/CN2022/099075, filed on Jun. 16, 2022.

(30) Foreign Application Priority Data

Jun. 29, 2021 (CN) ......................... 202110726646.8

(51) Int. Cl.
*H10D 30/67* (2025.01)
*H10D 10/01* (2025.01)
(Continued)

(52) U.S. Cl.
CPC ........... *H10D 30/675* (2025.01); *H10D 10/01* (2025.01); *H10D 12/211* (2025.01);
(Continued)

(58) Field of Classification Search
None
See application file for complete search history.

(56) References Cited

U.S. PATENT DOCUMENTS

2013/0075750 A1* 3/2013 Minoura ............ H10D 30/4755 257/E21.09
2020/0035666 A1* 1/2020 Shibib ................ H10D 62/8503
2020/0303532 A1 9/2020 Lin et al.

FOREIGN PATENT DOCUMENTS

CN 103022119 A 4/2013
CN 103904114 A 7/2014
(Continued)

OTHER PUBLICATIONS

First Office Action issued in counterpart Chinese Patent Application No. 202110726646.8, dated Jun. 26, 2024.
(Continued)

*Primary Examiner* — Hung K Vu
(74) *Attorney, Agent, or Firm* — Westbridge IP LLC

(57) ABSTRACT

Disclosed are a GaN power device and a manufacturing method thereof. The GaN power device includes a substrate, and a buffer layer, a GaN channel layer and a barrier layer sequentially stacked on the substrate from bottom to top. The barrier layer is provided with a p-GaN cap layer and a p-GaN thin layer, and the p-GaN thin layer is configured to cover the surface of the barrier layer and is connected to the p-GaN cap layer; the upper surface of the barrier layer is also provided with an input electrode and an output electrode, and a control electrode is provided on the upper surface of the p-GaN cap layer. The control electrode and the p-GaN thin layer are located between the input electrode and the output electrode.

9 Claims, 5 Drawing Sheets

(51) Int. Cl.

| | |
|---|---|
| ***H10D 12/00*** | (2025.01) |
| ***H10D 30/01*** | (2025.01) |
| ***H10D 30/47*** | (2025.01) |
| ***H10D 62/85*** | (2025.01) |
| ***H10D 64/01*** | (2025.01) |
| ***H10D 64/64*** | (2025.01) |

(52) U.S. Cl.
CPC ......... *H10D 30/015* (2025.01); *H10D 30/475* (2025.01); *H10D 30/6738* (2025.01); *H10D 62/85* (2025.01); *H10D 62/8503* (2025.01); *H10D 64/01* (2025.01); *H10D 64/64* (2025.01)

(56) References Cited

FOREIGN PATENT DOCUMENTS

| | | | |
|---|---|---|---|
| CN | 106783960 | A | 5/2017 |
| CN | 107240549 | A | 10/2017 |
| CN | 108962752 | A | 12/2018 |
| CN | 109742142 | A | 5/2019 |
| CN | 208819832 | U | 5/2019 |
| CN | 112736140 | A | 4/2021 |

OTHER PUBLICATIONS

International Search Report and Written Opinion issued in corresponding PCT Application No. PCT/CN2022/099075, dated Jul. 27, 2022.

Second Office Action issued in counterpart Chinese Patent Application No. 202110726646.8, dated Nov. 1, 2024.

* cited by examiner

GAN POWER DEVICE AND MANUFACTURING METHOD THEREOF

CROSS-REFERENCE TO RELATED APPLICATIONS

The present application is a continuation application of International Application No. PCT/CN2022/099075, filed on Jun. 16, 2022, which claims priority to Chinese Patent Application No. 202110726646.8, filed on Jun. 29, 2021. The disclosures of the above-mentioned applications are incorporated herein by reference in their entireties.

TECHNICAL FIELD

The present application relates to the technical field of semiconductor, in particular to a gallium nitride (GaN) power device and a manufacturing method thereof.

BACKGROUND

Applying a high voltage to the drain electrode of GaN devices will lead to an increase in the on-resistance of the GaN devices. This phenomenon is called the current collapse effect, which will affect the dynamic stability of the devices, degrade their conduction characteristics, and limit the further development of GaN devices. Therefore, how to suppress the current collapse effect in GaN devices and improve the conduction characteristics of devices is a research hotspot of GaN devices.

In the related art, Matsushita Electric Co., Ltd. proposes to introduce an additional layer of p-GaN structure connected to the drain electrode in the drain region through selective etching to suppress the current collapse effect (see literature: H. Okita, M. Hikita, A. Nishio, et al. Through Recess and Regrowth Gate Technology for Realizing Process Stability of GaN-Based Gate Injection Transistors [J]. IEEE Transactions on Electron Devices, 2017, 64 (3): 1026-1031); in order to realize the enhancement mode device by the technology, it is necessary to completely etch away the barrier layer in the gate region, and after the etching is completed, a thinner barrier layer is epitaxially formed to form a two-dimensional electron gas channel in the gate region, which makes the preparation process of the device more complicated and the threshold voltage of the device difficult to control accurately. Not only that, completely etching away the barrier layer will expose the channel layer to the etching gas, which will cause more damage and defects in the channel layer and reduce the mobility of the two-dimensional electron gas.

In the related art, a polarization superjunction field effect transistor (FET) with a long p-GaN gate electrode was provided by POWDEC Corporation of Japan (S. Hirata, F. Nakamura and H. Kawai, et al. 600V Switching Characteristics of GaN Polarization SuperJunction (PSJ) Transistors on Sapphire substrate. Autumn meeting of the Japanese Applied Physics, 2014) to increase the breakdown voltage of the device. However, the device is a depletion mode (normally-on) device, and the normally-on device in the circuit increases the complexity of circuit design and reduces the reliability of the system.

The above content is only configured to assist in understanding the technical solution of the present application, and does not represent an admission that the above content is prior art.

SUMMARY

The main purpose of the present application is to provide a GaN power device and a manufacturing method thereof, aiming to solve the technical problem of on-resistance degradation caused by current collapse effect in GaN power devices in the related art.

In order to achieve the above purpose, the present application provides a gallium nitride (GaN) power device, including:

- a substrate;
- a buffer layer;
- a GaN channel layer; and
- a barrier layer;
- wherein the buffer layer, the GaN channel layer and the barrier layer are stacked sequentially from bottom to top on the substrate;
- a p-GaN cap layer and a p-GaN thin layer are provided on the barrier layer, and the p-GaN thin layer is configured to cover a surface of the barrier layer and is connected to the p-GaN cap layer; and
- an input electrode and an output electrode are also provided on an upper surface of the barrier layer, and a control electrode is provided on an upper surface of the p-GaN cap layer; the control electrode and the p-GaN thin layer are located between the input electrode and the output electrode.

In an embodiment, the GaN power device is an enhancement mode GaN high electron mobility transistor (HEMT) device; one electrode of a drain electrode and a source electrode of the enhancement mode GaN HEMT device is configured to correspond to the input electrode, and the other electrode of the source electrode and the drain electrode of the enhancement mode GaN HEMT device is configured to correspond to the output electrode; a gate electrode of the enhancement mode GaN HEMT device is configured to correspond to the control electrode.

In an embodiment, the p-GaN thin layer is connected to the drain electrode through a metal electrode, and a schottky contact is formed between the metal electrode and the p-GaN thin layer.

In an embodiment, a number of the p-GaN cap layers is multiple, and a gate electrode is provided on each of the p-GaN cap layers correspondingly.

In an embodiment, a number of the p-GaN cap layers is two.

In an embodiment, the GaN power device is a GaN diode; an anode of the GaN diode is configured to correspond to the input electrode, and a cathode of the GaN diode is configured to correspond to the output electrode; the anode of the GaN diode is electrically connected to the control electrode.

In an embodiment, the p-GaN cap layer and the p-GaN thin layer are configured to deplete the two-dimensional electron gas in the area covered by the p-GaN cap layer and the p-GaN thin layer to make the GaN power device appear in an off state without external bias voltage.

In an embodiment, a thickness of the p-GaN thin layer is uniform or changes in a step-like manner.

In an embodiment, the thickness of the p-GaN thin layer is 1 nm to 400 nm.

In addition, in order to achieve the above purpose, the present application provides a method for manufacturing a GaN power device, including:

- obtaining a basic structure of the GaN power device, wherein the basic structure includes a substrate, a buffer layer, a GaN channel layer and a barrier layer stacked in sequence from bottom to top;
- depositing a p-GaN epitaxial layer on the barrier layer of the basic structure;

etching the p-GaN epitaxial layer to form a p-GaN thin layer and a p-GaN cap layer connected to the p-GaN thin layer on an upper surface of the barrier layer; and providing a control electrode on the p-GaN cap layer, and providing an input electrode and an output electrode on the upper surface of the barrier layer; wherein the control electrode and the p-GaN thin layer are located between the input electrode and the output electrode.

In an embodiment, the etching the p-GaN epitaxial layer to form the p-GaN thin layer and the p-GaN cap layer connected to the p-GaN thin layer on the upper surface of the barrier layer includes:

determining a target number of the p-GaN cap layer and/or state parameters of the p-GaN thin layer according to device design requirements; wherein the state parameters include shape and thickness; and etching the p-GaN epitaxial layer according to the target number of the p-GaN cap layer and/or the state parameters of the p-GaN thin layer to form the p-GaN cap layers with the target number and spaced apart from each other on the upper surface of the barrier layer, and/or, to form the p-GaN thin layer corresponding to the state parameters; wherein the p-GaN cap layer near one end of the output electrode is connected to the p-GaN thin layer.

In an embodiment, after the providing the control electrode on the p-GaN cap layer, and providing the input electrode and the output electrode on the upper surface of the barrier layer, the method further includes:

in response to that the GaN power device is an enhancement mode GaN HEMT device, connecting the p-GaN thin layer to a drain electrode through a metal electrode to form a schottky contact between the metal electrode and the p-GaN thin layer.

In an embodiment, after the providing the control electrode on the p-GaN cap layer, and providing the input electrode and the output electrode on the upper surface of the barrier layer, the method further includes:

in response to that the GaN power device is a GaN diode, electrically connecting an anode of the GaN diode to the control electrode through an external connection wire.

The present application provides a GaN power device, including a substrate, a buffer layer, a GaN channel layer and a barrier layer stacked sequentially from bottom to top on the substrate. a p-GaN cap layer and a p-GaN thin layer are provided on the barrier layer, and the p-GaN thin layer is configured to cover a surface of the barrier layer and is connected to the p-GaN cap layer; the upper surface of the barrier layer is also provided with an input electrode and an output electrode. A control electrode is provided on the upper surface of the GaN cap layer, and the control electrode and the p-GaN thin layer are located between the input electrode and the output electrode. In the present application, by providing a p-GaN thin layer and a p-GaN cap layer connected with each other on the surface of the barrier layer, the shielding effect of the p-GaN thin layer on the surface traps is configured to weaken the effect of the surface traps on the barrier layer on the modulation effect of the two-dimensional electron gas, so as to effectively suppresses the current collapse effect caused by trapping electrons on the surface of the barrier layer; not only that, the hole injection effect achieved through the p-GaN cap layer and p-GaN thin layer can effectively suppress the current collapse effect caused by buffer layer traps.

The realization of the purpose, functional features and advantages of the present application will be further described with reference to the embodiments and the accompanying drawings.

DETAILED DESCRIPTION OF THE EMBODIMENTS

It should be understood that the specific embodiments described herein are only used to explain the present application and are not intended to limit the present application.

First Embodiment

Figure 1:
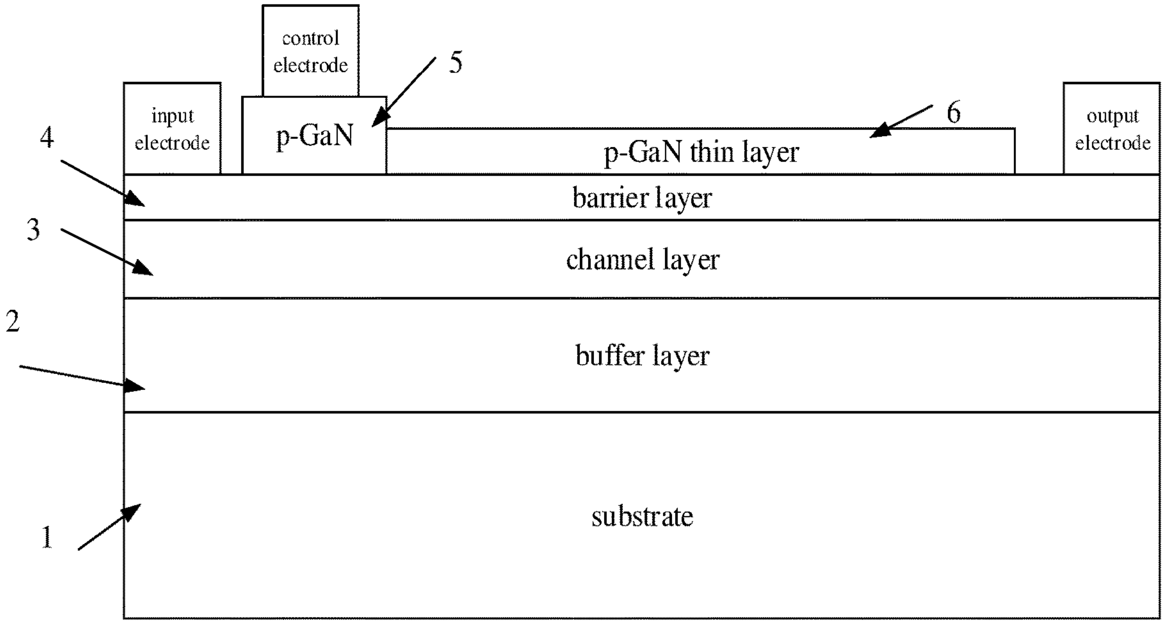
FIG. 1 is a two-dimensional cross-sectional view of an enhancement mode GaN HEMT device according to a first embodiment of the present application.

Referring to FIG. 1, FIG. 1 is a two-dimensional cross-sectional view of the enhancement mode GaN HEMT device according to the present application. The first embodiment of the GaN power device of the present application is provided based on FIG. 1.

In this embodiment, the GaN power device includes a substrate 1 and a buffer layer 2, a GaN channel layer 3 and a barrier layer 4 stacked sequentially on the substrate 1 from bottom to top. There is a p-GaN cap layer 5 and a p-GaN thin layer 6 provided on the barrier layer 4, and the p-GaN thin layer 6 covers the surface of the barrier layer 4 and is connected to the p-GaN cap layer 5.

The upper surface of the barrier layer 4 is also provided with an input electrode and an output electrode. The upper surface of the p-GaN cap layer is provided with a control electrode. The control electrode and the p-GaN thin layer 6 are located between the input electrode and the output electrode.

It should be understood that a GaN power device is a type of semiconductor power device, and the GaN power device usually includes a GaN channel layer 3 inside. The GaN power device can be a GaN light-emitting diode (LED), a metal-insulator-semiconductor (MIS) structure enhancement mode HEMT device, a Schottky diode, a PN junction diode and other power devices. The p-GaN cap layer 5 and the p-GaN thin layer 6 can be generated by p-GaN epitaxial layer etching. The barrier layer 4 is an aluminum gallium nitride (AlGaN), aluminum nitride (AlN) or the composites of AlGaN and AlN.

In this embodiment, the substrate 1 can be a silicon substrate, a sapphire substrate, or a silicon carbide substrate for carrying GaN power devices. The buffer layer 2 is provided between the channel and the substrate 1 to balance stress during the epitaxial process, reduce device leakage current, and increase breakdown voltage. The GaN channel layer 3 is the conductive channel of the power device; the barrier layer 4 is a structure used to generate two-dimensional electron gas. This structure can generate two-dimensional electron gas through the polarization effect at the connection with the GaN channel layer 3. The p-GaN power device also includes passivation layer, field plate and other structures, which are not shown in the figure, but in this embodiment and other embodiments described later, corresponding structures are included.

A control electrode is provided on the upper surface of the p-GaN cap layer 5 to control whether the GaN power device is turned on. This electrode can be the gate electrode of the metal-oxide-semiconductor (MOS) tube, the base of the triode or the anode of the diode (in the case that GaN power device is a diode, the anode of the diode is connected to the control electrode), etc. According to different GaN power devices, the input electrode, the output electrode and the control electrode are not exactly the same and can be determined according to the specific device.

In this embodiment, since the p-GaN thin layer 6 is provided on the upper surface of the barrier layer 4, it can effectively shield the traps on the surface of the barrier layer 6, weaken the trapping effect of electrons by the traps on the surface of the barrier layer 4, and suppress the current collapse effect caused by traps trapping electrons on the surface of the barrier layer. The p-GaN cap layer 5 can be used to deplete the two-dimensional electron gas generated by the barrier layer 4.

Therefore, in this embodiment, by providing a p-GaN thin layer and a p-GaN cap layer connected to each other on the surface of the barrier layer, the shielding effect of the p-GaN thin layer on the traps on the surface of the barrier layer is used to weaken the surface traps of the barrier layer on the modulation effect of the two-dimensional electron gas, so as to effectively suppresses the current collapse effect caused by traps trapping electrons on the surface of the barrier layer.

Second Embodiment

Based on the first embodiment of the GaN power device mentioned above, a second embodiment of the GaN power device of the present application is provided.

In this embodiment, the GaN power device is an enhancement mode GaN HEMT device. At this time, one electrode of the drain electrode 9 and the source electrode 8 of the enhancement mode GaN HEMT device corresponds to the input electrode, and the other electrode of the source electrode 8 and the drain electrode 9 of the GaN HEMT device corresponds to the output electrode; the gate electrode 7 of the enhancement GaN HEMT device corresponds to the control electrode.

In this embodiment, three electrodes (input electrode, output electrode and control electrode) is mainly described, such as a triode, a positive channel metal oxide semiconductor (PMOS) tube, an insulate-gate bipolar transistor (IGBT), etc. When the drain electrode 9 corresponds to the input electrode, the source electrode 8 corresponds to the output electrode; similarly, when the drain electrode 9 corresponds to the output electrode, the source electrode 8 corresponds to the input electrode.

Figure 2:
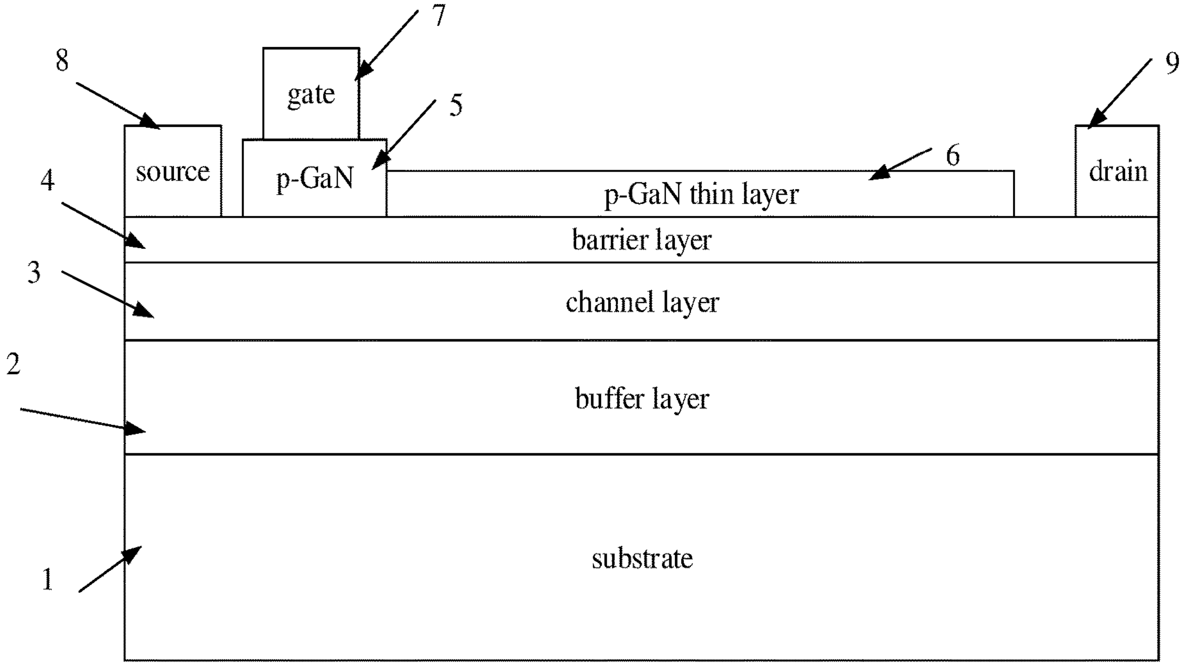
FIG. 2 is a two-dimensional cross-sectional view of the enhancement mode GaN HEMT device according to a second embodiment of the present application.
Figure 3:
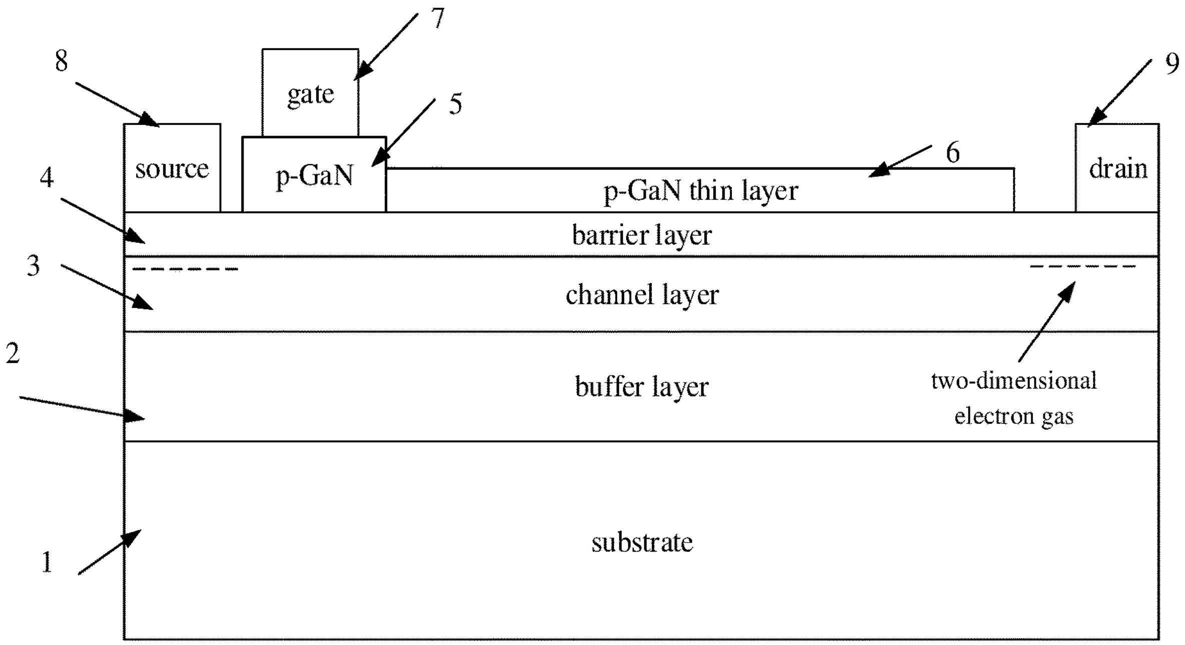
FIG. 3 is a schematic view of a two-dimensional electron gas distribution of the enhancement mode GaN HEMT device without external bias voltage according to the second embodiment of the present application.

In FIGS. 2 and 3, the p-GaN thin layer 6 covers the surface of the barrier layer and can adjust the conduction band energy level at the two-dimensional electron gas channel. In FIG. 3, due to the existence of p-GaN cap layer 5 and p-GaN thin layer 6 in the enhancement mode GaN HEMT device, the conduction band energy level at the two-dimensional electron gas channel can be raised. It can be seen from FIG. 3, the two-dimensional electron gas under the area covered by p-GaN cap layer 5 and p-GaN thin layer 6 is completely depleted, causing the power device to appear in an off state without external bias voltage; it can be seen from this, in the present application, the p-GaN cap layer 5 and the p-GaN thin layer 6 have conductivity, and the conductivity of the p-GaN cap layer 5 and the p-GaN thin layer 6 can be used to consume the two-dimensional electron gas in the area covered by the p-GaN cap layer 5 and the p-GaN thin layer 6. In the absence of bias voltage, the two-dimensional electron gas in the area covered by the p-GaN cap layer 5 and the p-GaN thin layer 6 will be completely depleted.

Figure 4:
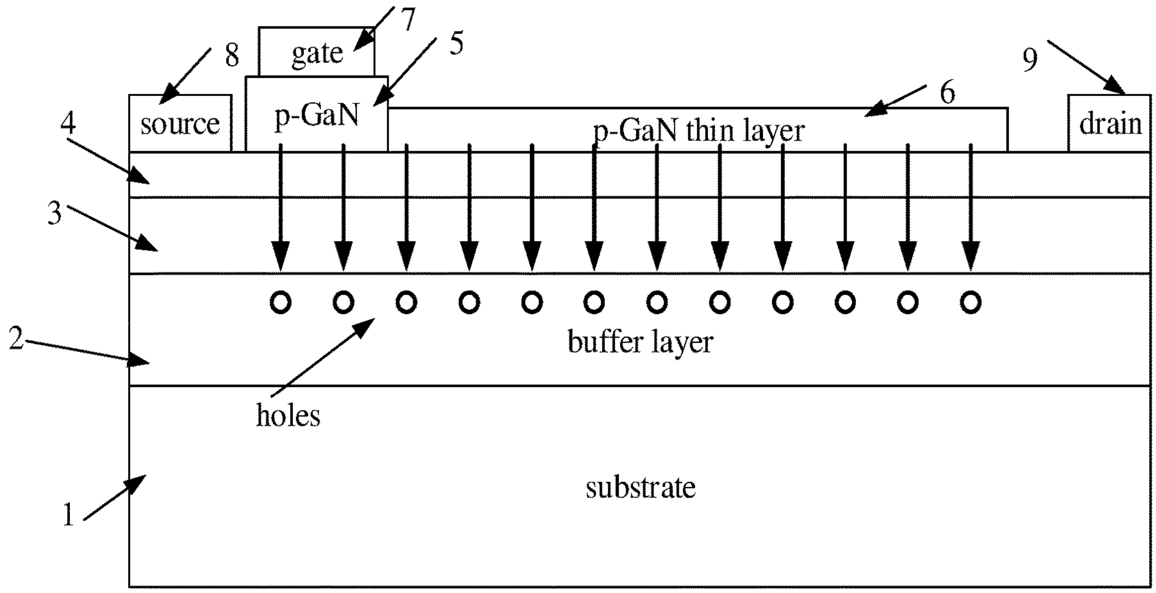
FIG. 4 is a schematic view of a hole injection phenomenon excited by a p-GaN thin layer in the enhancement mode GaN HEMT device according to the second embodiment of the present application.

In addition, referring to FIG. 4, due to the existence of the p-GaN thin layer 6, when the voltage difference between the gate electrode and the source electrode is greater than zero, holes in the p-GaN thin layer 6 can be injected into the device, thereby neutralizing the ions inside the device to reduce the repulsive effect of the negative charge center on the two-dimensional electron gas, and thereby effectively suppressing the degradation of dynamic conduction characteristics caused by the deep-level negative charge center in the buffer layer.

Two-dimensional electron gas can optimize the characteristics of power devices and reduce the conduction losses of power devices. Usually the two-dimensional electron gas is mainly realized by applying a bias voltage to the gate electrode 7. In this embodiment, the p-GaN thin layer 6 is connected to the gate electrode 7, so the p-GaN thin layer can play the same role as the gate electrode. More two-dimensional electron gas can be induced under the barrier layer 4 by applying a bias voltage to the gate electrode 7, thereby optimizing the conduction characteristics of the device and reducing the conduction loss of the device.

Figure 5:
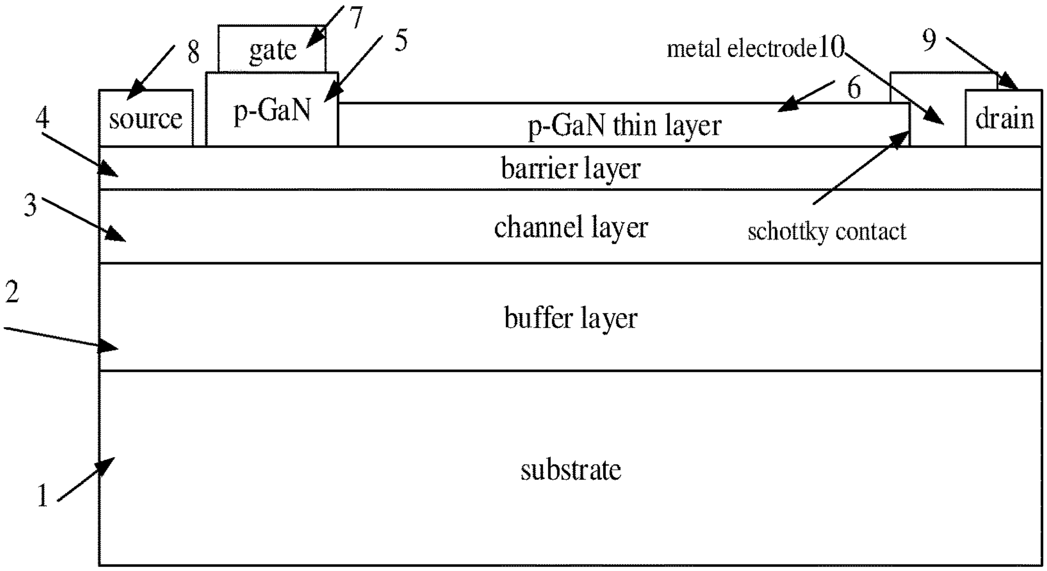
FIG. 5 is a schematic view of the p-GaN thin layer and a drain electrode connected through a metal electrode in the enhancement mode GaN HEMT device according to the second embodiment of the present application.

Referring to FIG. 5, in this embodiment, the p-GaN thin layer 6 is connected to the drain electrode 9 through a metal electrode 10, and a Schottky contact is formed between the metal electrode 10 and the p-GaN thin layer 6.

It should be understood that the metal electrode 10 is an electrode with good conductivity, and the metal electrode 10 can establish a connection between the drain electrode 9 and the p-GaN thin layer 6, thereby forming a Schottky contact between the metal electrode 10 and the p-GaN thin layer 6. The Schottky contact means that when metal and semiconductor materials are in contact, the energy band of the semiconductor bends at the interface, forming a Schottky barrier. The existence of Schottky barrier will produce large interface resistance. Corresponding to this is ohmic contact, where the potential barrier at the interface is very small or there is no contact barrier.

Considering that power devices need to meet certain voltage resistance requirements, the higher the voltage resistance capability of the power device, the higher the voltage impact that the power device can withstand. In this embodiment, the p-GaN thin layer 6 is connected to the drain electrode 9 through a metal electrode 10. A Schottky contact is formed between the metal electrode 10 and the p-GaN thin layer 6. When the device is turned off, the Schottky contact method can form a Schottky barrier and generate a large interface resistance between the metal electrode 10 and the p-GaN thin layer 6. At this time, reverse bias will assist p-GaN depletion, thereby improving the voltage resistance performance of the device.

Third Embodiment

Based on the second embodiment of the GaN power device mentioned above, a third embodiment of the GaN power device of the present application is provided.

In this embodiment, there are multiple p-GaN cap layers 5, and each p-GaN cap layer 5 is provided with a gate electrode 8 correspondingly.

Figure 6:
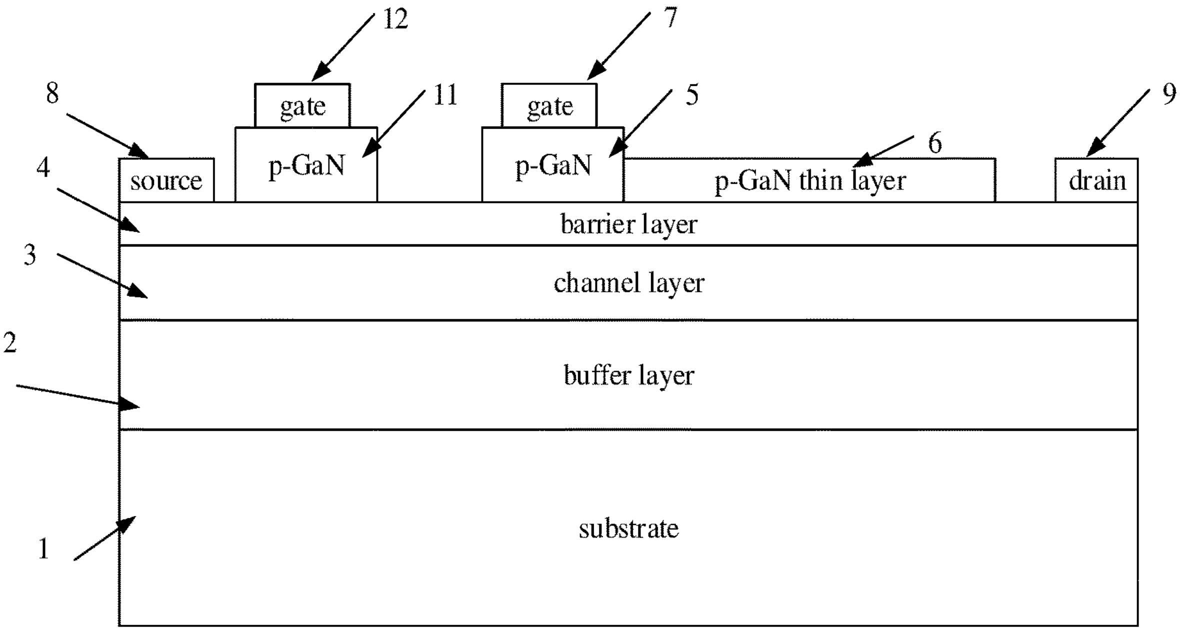
FIG. 6 is a schematic structural view of multiple p-GaN cap layers provided in the enhancement mode GaN HEMT device according to a third embodiment of the present application.

Referring to FIG. 6, it should be understood that in this embodiment, the number of p-GaN cap layers 5 provided between the source electrode 8 and the drain electrode 9 can be multiple. When the gate electrode 8 of each p-GaN cap layer 5 are connected, multiple gate electrodes 8 can be used to control the on-off state of the power device to avoid the inability to normally control the on and off of the power device if a fault occurs between one gate electrode 8 and the corresponding p-GaN cap layer 5.

In addition, considering that applying a stable bias voltage through the p-GaN cap layer 5 can not only maintain the stability of the current and avoid the current collapse effect, but also induce more channel electrons in the channel layer by this stable bias voltage to improve the ion transmission capability of the power device in the conduction state. When multiple p-GaN cap layers 5 and corresponding gate electrodes 8 are provided, a stable bias voltage can be applied to some of the p-GaN cap layers 5 and corresponding gate electrodes 8 to suppress the current collapse effect and induce more channel electrons to improve the ion transmission capability of the power device in the conduction state.

It should be understood that, in FIG. 6, a power device including two p-GaN cap layers 5 is used as an example for illustration, which includes the first p-GaN cap layer 5 and the corresponding gate electrode 8, and the second p-GaN cap layer 5 and the corresponding second gate electrode 12. In this embodiment, the number of the p-GaN cap layer 5 and the corresponding gate electrode 8 can be three, four or more. During the setting process, the number of the p-GaN cap layer 5 can be determined according to the specific dimension of the power device.

Fourth Embodiment

Based on the first embodiment of the GaN power device mentioned above, a fourth embodiment of the GaN power device of the present application is provided.

Figure 7:
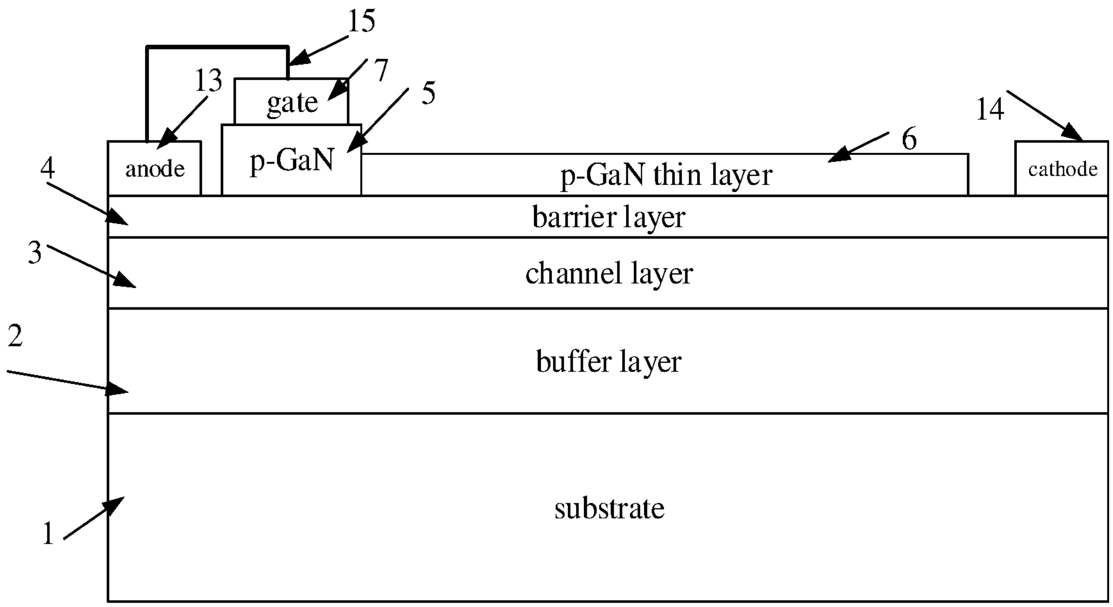
FIG. 7 is a two-dimensional cross-sectional view of the GaN diode according to a fourth embodiment of the present application.

Referring to FIG. 7, in this embodiment, the GaN power device is a GaN diode. The anode 13 of the GaN diode corresponds to the input electrode, and the cathode 14 of the GaN diode corresponds to the output electrode; the anode 13 of the GaN diode is electrically connected to the control electrode (gate electrode 7).

It should be understood that the GaN power device also includes a GaN diode with two electrode ends. Usually the diode only includes two electrodes (anode 13 and cathode 14). Considering that electrodes need to be provided on the p-GaN cap layer 5 to adjust the performance of the device. Therefore, in this embodiment, the anode 14 can be connected to the control electrode (gate electrode 7) provided on the p-GaN cap layer 5. At this time, by adjusting the level of the voltage applied to the anode 14, the on-off state of the GaN diode can be controlled.

In this embodiment, the anode 13 of the GaN diode can be an ohmic contact or a Schottky contact, which can be set according to actual requirements. Of course, in addition to being connected to the gate electrode 7 through the external connection wire 15, the anode 13 can also be connected to the gate electrode 7 through a metal connection structure or directly in contact with the gate electrode 7, which is not specifically limited here.

In this embodiment, by providing the connected p-GaN thin layer 6 and the p-GaN cap layer 5 on the surface of the barrier layer 4 of the GaN diode, the p-GaN thin layer 6 can also be used to shield traps on the surface of the barrier layer, and weaken the trapping effect of electrons on the surface of the barrier layer, thereby effectively suppressing the current collapse effect caused by traps trapping electrons on the surface of the barrier layer.

In addition, in this embodiment, multiple p-GaN cap layers 5 and corresponding gate electrodes 8 may also be provided on the barrier layer 4, and some of the p-GaN cap layers 5 and corresponding gate electrodes 8 are not connected with the anode 13. This structure can also apply a stable bias voltage through the p-GaN cap layer 5, which can not only maintain the stability of the current and avoid the current collapse effect, but also use this stable bias voltage to induce more channel electrons in the channel layer to improve the conductivity of the power device in the on state.

Fifth Embodiment

Based on any one of the embodiments from the above-mentioned first embodiment to fourth embodiment of the GaN power device, a fifth embodiment of the GaN power device of the present application is provided.

Figure 8:
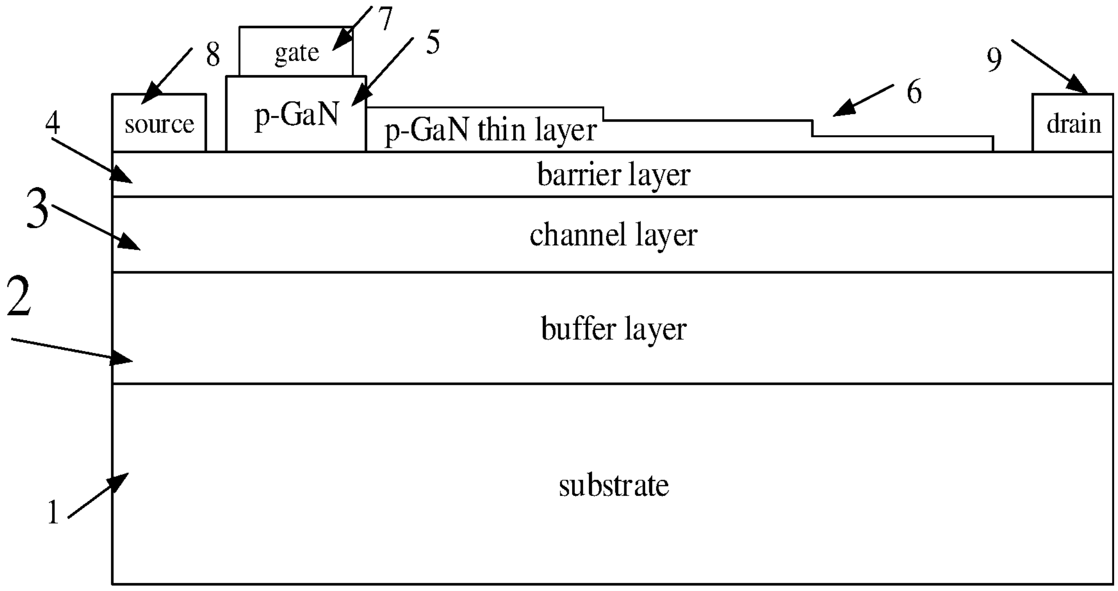
FIG. 8 is a schematic structural view of the p-GaN thin layer in a GaN power device according to a fifth embodiment of the present application.

In this embodiment, considering that the p-GaN thin layer 6 is actually used, the actual structure of the p-GaN thin layer 6 does not need to be limited. It is only ensured that the p-GaN thin layer 6 exists on the barrier layer 4, and the current collapse effect can be suppressed. However, in the actual setting process, the p-GaN thin layer 6 can be set into a structure with a uniform thickness, as shown in FIGS. 1 to 7; of course, the p-GaN thin layer 6 can be set into a stepped structure, as shown in FIG. 8, taking the step-like change structure that gradually decreases from left to right as an example. In this embodiment, a stepped structure that gradually decreases from right to left can also be configured, or other structures, as long as it ensures that there is a certain contact surface between the p-GaN thin layer 6 and the barrier layer 4, such as a trapezoidal structure or triangular structure, etc.

In addition, in this embodiment, the thickness of the p-GaN thin layer 6 can be selected in the range of 1-400 nm. Since the presence of the p-GaN thin layer 6 can shield the surface traps of the barrier layer 4, even if the thickness of the p-GaN thin layer 6 is 1 nm, it can be shielded.

Considering that when a bias voltage is applied to the control electrode, the p-GaN thin layer 6 can generate holes and inject them into the power device, which can neutralize the ions inside the device and reduce the repelling effect of the negative center on the two-dimensional electron gas, thereby effectively suppressing the degradation of dynamic conduction characteristics caused by deep level negative centers in the buffer layer. In order to ensure that the p-GaN thin layer 6 can generate enough holes, the thickness of the p-GaN thin layer 6 can also be set relatively thick, for example, 400 nm.

In addition, in order to avoid the large size of the p-GaN thin layer 6 and to maintain the function of the p-GaN thin layer 6 in suppressing the current collapse effect and generating holes into the power device, in this embodiment, the thickness of the p-GaN thin layer 6 is set to 20 nm. The 20 nm thick p-GaN thin layer 6 can not only suppress the current collapse effect and the effect of hole injection into the power device, but also prevent the size of the p-GaN thin layer 6 from being too large.

Sixth Embodiment

Based on the first embodiment to the fifth embodiment of the GaN power device, a sixth embodiment of the GaN power device manufacturing method of the present application is provided.

Figure 9:
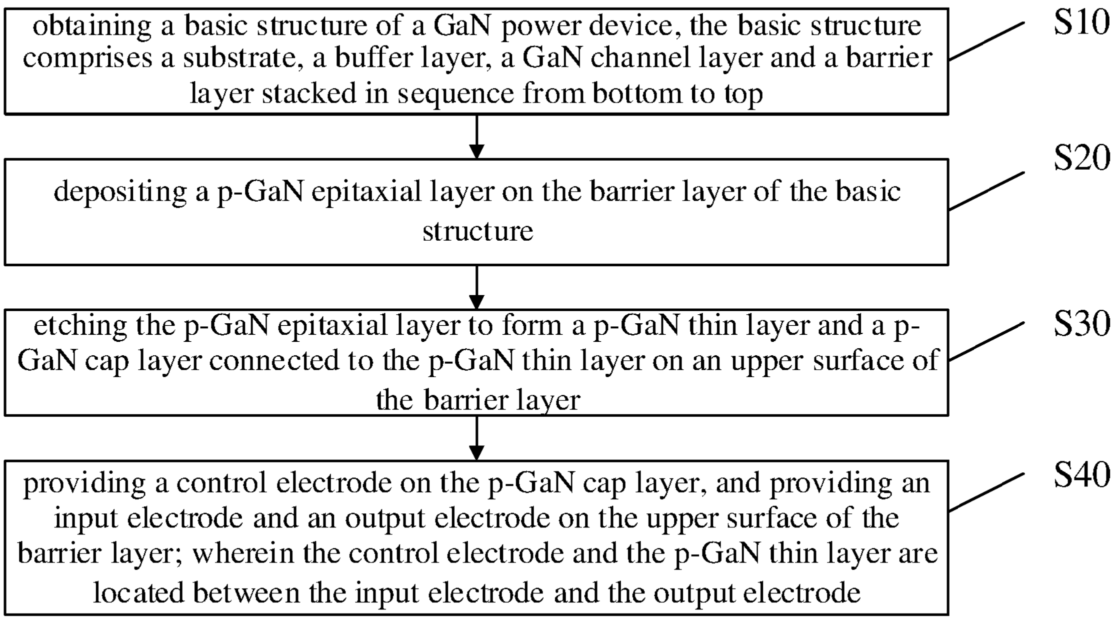
FIG. 9 is a schematic flow chart of a method for manufacturing a GaN power device according to a sixth embodiment of the present application.

Referring to FIG. 9, in this embodiment, the manufacturing method for the GaN power device includes:

S10: obtaining the basic structure of the GaN power device, which includes a substrate, a buffer layer, a GaN channel layer and a barrier layer stacked in sequence from bottom to top.

It should be noted that this basic structure is a partial structure of an unimproved GaN power device. The basic structure includes a substrate, a buffer layer, a GaN channel layer and a barrier layer stacked in sequence from bottom to top. In this embodiment, the substrate in the basic structure can be a silicon substrate, a sapphire substrate, or a silicon carbide substrate for carrying GaN power devices. The buffer layer placed between the channel and the substrate is a structure used to balance stress during the epitaxial process, reduce device leakage current, and increase breakdown voltage. The GaN channel layer is the conductive channel of the power device; the barrier layer is a structure used to generate two-dimensional electron gas. This structure can generate two-dimensional electron gas through the polarization effect at the connection with the GaN channel layer.

In a specific implementation, the substrate can be selected first, and then the buffer layer, GaN channel layer and barrier layer can be sequentially deposited on the substrate to obtain the basic structure. Of course, it can also be obtained through other methods, which are not limited in this embodiment.

S20: depositing a p-GaN epitaxial layer on the barrier layer of the basic structure.

It should be understood that the p-GaN epitaxial layer is a structure provided on the barrier layer, and the p-GaN epitaxial layer is used to make the p-GaN thin layer and the p-GaN cap layer. In a specific implementation, the p-GaN epitaxial layer can be deposited on the barrier layer by physical deposition or chemical deposition.

S30: etching the p-GaN epitaxial layer to form a connected p-GaN thin layer and a p-GaN cap layer on the upper surface of the barrier layer.

It can be understood that since the p-GaN thin layer is provided on the upper surface of the barrier layer, it can effectively shield the traps on the surface of the barrier layer, weaken the trapping effect of the traps on the surface of the barrier layer on electrons, and suppress the current collapse effect caused by traps trapping electrons on the surface of the barrier layer.

It should be noted that after the p-GaN epitaxial layer is set, the corresponding p-GaN thin layer and p-GaN cap layer can be formed on the barrier layer by etching. The etching method of the p-GaN epitaxial layer can be photolithography or chemical gas etching, which is not specifically limited in this embodiment.

In addition, considering that the thickness of the p-GaN thin layer and the p-GaN cap layer may be different, in the specific etching process, one of the structures of the p-GaN thin layer and the p-GaN cap layer can be etched first, and then the protective structure is used to protect the p-GaN thin layer or p-GaN cap layer that is etched first, and then another structure is etched.

S40: providing a control electrode on the p-GaN cap layer, and providing an input electrode and an output electrode on the upper surface of the barrier layer. The control electrode and the p-GaN thin layer are located between the input electrode and output electrode.

It can be understood that the control electrode provided on the upper surface of the p-GaN cap layer is an electrode that controls whether the GaN power device is turned on. This electrode can be the gate electrode of the MOS tube, the base of the triode or the anode of the diode (when the GaN power device is a diode, the anode of the diode is connected to the control electrode), etc. According to different GaN power devices, the input electrode, output electrode and control electrode are not exactly the same and can be determined according to the specific device.

In this embodiment, the input electrode, the output electrode and the control electrode may be provided on the corresponding barrier layer or p-GaN cap layer through ohmic contact or Schottky contact.

In addition, in this embodiment, after the electrodes are provided, structures such as passivation layers and field plates for power devices need to be set. This part of the structure can be made using conventional manufacturing methods and is not specifically limited here.

In this embodiment, by providing a connected p-GaN thin layer and a p-GaN cap layer on the surface of the barrier layer, the shielding effect of the p-GaN thin layer on the traps on the surface of the barrier layer is used to weaken the traps on the surface of the barrier layer on the trapping effect of electrons, so as to effectively suppress the current collapse effect caused by traps trapping electrons on the surface of the barrier layer.

Further, the step S30 specifically includes: determining the target number of the p-GaN cap layer and/or the state parameters of the p-GaN thin layer according to device design requirements. The state parameters include shape and thickness.

It should be understood that the device design requirements are the requirements corresponding to the power device effects that need to be considered when designing GaN power devices. Different GaN power devices have different device design requirements, resulting in the emergence of GaN power devices with different parameter models.

It should be noted that the target number of p-GaN cap layers and the shape and thickness of the p-GaN thin layer will affect the performance of GaN power devices. Different numbers of p-GaN cap layers or p-GaN thin layers of different shapes and thicknesses correspond to different performance of GaN power devices. For example, if a single p-GaN cap layer is provided, the p-GaN cap layer needs to be used in conjunction with the control electrode to control the on-off state of the GaN power device; when multiple p-GaN cap layers are provided, some p-GaN cap layers can be considered to form a bias voltage on the barrier layer to improve the conduction effect of GaN power devices.

Therefore, before etching the p-GaN epitaxial layer, it is necessary to determine the target number of p-GaN cap layers and/or the state parameters of the p-GaN thin layer according to device design requirements. This includes the process of determining the target number of p-GaN cap layers, the state parameters of the p-GaN thin layer, and the target number of p-GaN cap layers and the state parameters of the p-GaN thin layer.

Etching the p-GaN epitaxial layer according to the target number of the p-GaN cap layer and/or the state parameters of the p-GaN thin layer to form the p-GaN cap layers with the target number and spaced apart from each other on the upper surface of the barrier layer, and/or, to form the p-GaN thin layer corresponding to the state parameters; the p-GaN cap layer near one end of the output electrode is connected to the p-GaN thin layer.

It can be understood that when the target number of p-GaN cap layers and/or the state parameters of the p-GaN thin layer are determined, the p-GaN epitaxial layer can be etched directly according to the above parameters to form the target number of p-GaN cap layers spaced apart from each other on the upper surface of the barrier layer, and the p-GaN cap layer near one end of the output electrode is connected to the p-GaN thin layer; and/or the effect of the p-GaN thin layer corresponding to the state parameters.

In some embodiments, after the step S40, the method further includes: when the GaN power device is an enhancement mode GaN HEMT device, connecting the p-GaN thin layer to the drain electrode through a metal electrode, and forming Schottky contact between the metal electrode and the p-GaN thin layer.

It can be understood that when the GaN power device is an enhancement mode GaN HEMT device, the p-GaN thin layer can be connected to the drain electrode through a metal electrode. The metal electrode is an electrode with good conductivity. The metal electrode can establish a connection between the drain electrode and the p-GaN thin layer, thereby forming a Schottky contact between the metal electrode and the p-GaN thin layer. Schottky contact means that when metal and semiconductor materials are in contact, the energy band of the semiconductor bends at the interface, forming a Schottky barrier. The existence of Schottky barrier will produce large interface resistance. Corresponding to this is ohmic contact, where the potential barrier at the interface is very small or there is no contact barrier.

Considering that power devices need to meet certain voltage resistance requirements, the higher the voltage resistance capability of the power device, the higher the voltage impact that the power device can withstand. In this embodiment, the p-GaN thin layer is connected to the drain electrode through a metal electrode. A Schottky contact is formed between the metal electrode and the p-GaN thin layer. When the device is turned off, the Schottky contact way can form a Schottky barrier and create a large interface resistance between the metal electrode and the p-GaN thin layer. At this time, reverse bias will assist p-GaN depletion and improve the voltage resistance performance of the device.

In some embodiments, after the step S40, the method further includes: when the GaN power device is a GaN power device, electrically connecting the anode of the GaN diode to the control electrode through an external connection wire.

It should be understood that GaN power devices also include GaN diodes with two electrode ends. Usually a diode only includes two electrodes (anode and cathode). Considering that electrodes need to be provided on the p-GaN cap layer to adjust the performance of the power device. Therefore, in this embodiment, the anode can be connected to the control electrode (gate electrode) provided on the p-GaN cap layer. At this time, by adjusting the level of the voltage applied to the anode, the on-off state of the GaN diode can be controlled.

In this embodiment, the anode of the GaN diode can be an ohmic contact or a Schottky contact, which can be set according to actual requirements. Of course, in addition to being connected to the gate electrode through an external connection wire, the anode can also be connected to the gate electrode through a metal connection structure or directly contacted with the gate electrode, which is not specifically limited here.

It should be noted that, as used herein, the terms "comprise", "include" or any other variation thereof are intended to cover a non-exclusive inclusion, such that a process, method, article or system that includes a list of elements not only includes those elements, but also includes other elements not expressly listed or elements that are inherent to the process, method, article or system. Without further limitation, an element defined by the statement "comprises a . . . " does not exclude the presence of other identical elements in the process, method, article, or system that includes that element.

The above serial numbers of the embodiments of the present application are only for description and do not represent the advantages and disadvantages of the embodiments.

Through the above description of the embodiments, those skilled in the art can clearly understand that the methods of the above embodiments can be implemented by means of software plus the necessary general hardware platform. Of course, it can also be implemented by hardware, but in many cases the former is better. Based on this understanding, the technical solution of the present application can be embodied in the form of a software product that is essentially or contributes to the existing technology. The computer software product is stored in a storage medium (such as read-only memory/random access memory, magnetic disk, optical disk), including several events to cause a terminal device (which can be a mobile phone, computer, server, air conditioner, or network device, etc.) to execute the method described in various embodiments of the present application.

The above are only some embodiments of the present application, and do not limit the patent scope of the present application. Any equivalent structure or equivalent process transformation made using the description and drawings of the present application, or directly or indirectly used in other related technical fields, are all similarly included in the patent scope of the present application.

What is claimed is:

1. A gallium nitride (GaN) power device, comprising:
- a substrate;
- a buffer layer;
- a GaN channel layer; and
- a barrier layer;
- wherein the buffer layer, the GaN channel layer and the barrier layer are stacked sequentially from bottom to top on the substrate;
- a p-GaN cap layer and a p-GaN thin layer are provided on the barrier layer, and the p-GaN thin layer is configured to cover a surface of the barrier layer and is connected to the p-GaN cap layer;
- an input electrode and an output electrode are also provided on an upper surface of the barrier layer, and a control electrode is provided on an upper surface of the p-GaN cap layer; the control electrode and the p-GaN thin layer are located between the input electrode and the output electrode;

the GaN power device is an enhancement mode GaN high electron mobility transistor (HEMT) device; one electrode of a drain electrode and a source electrode of the enhancement mode GaN HEMT device is configured to correspond to the input electrode, and the other electrode of the source electrode and the drain electrode of the enhancement mode GaN HEMT device is configured to correspond to the output electrode; a gate electrode of the enhancement mode GaN HEMT device is configured to correspond to the control electrode;

the p-GaN thin layer is provided between the gate electrode and the drain electrode; and holes are provided inside the p-GaN thin layer;

in response to that no voltage is applied to the gate electrode, no two-dimensional electron gas exists beneath the p-GaN cap layer and the p-GaN thin layer; the p-GaN cap layer and the p-GaN thin layer are configured to deplete the two-dimensional electron gas in the area covered by the p-GaN cap layer and the p-GaN thin layer to make the GaN power device work in OFF-state without external gate bias; and in response to that a positive voltage is applied to the gate electrode, two-dimensional electron gas is generated beneath the barrier layer beneath the p-GaN cap layer and the p-GaN thin layer.

2. The GaN power device according to claim 1, wherein the p-GaN thin layer is connected to the drain electrode through a metal electrode, and a schottky contact is formed between the metal electrode and the p-GaN thin layer.

3. The GaN power device according to claim 1, wherein a number of the p-GaN cap layers is multiple, and a gate electrode is provided on each of the p-GaN cap layers correspondingly.

4. The GaN power device according to claim 3, wherein the number of the p-GaN cap layers is two.

5. The GaN power device according to claim 1, wherein a thickness of the p-GaN thin layer is uniform or changes in a step-like manner.

6. The GaN power device according to claim 1, wherein a thickness of the p-GaN thin layer is 1 nm to 400 nm.

7. A method for manufacturing a gallium nitride (GaN) power device, comprising:

obtaining a basic structure of the GaN power device, wherein the basic structure comprises a substrate, a buffer layer, a GaN channel layer and a barrier layer stacked in sequence from bottom to top;

depositing a p-GaN epitaxial layer on the barrier layer of the basic structure;

etching the p-GaN epitaxial layer to form a p-GaN thin layer and a p-GaN cap layer connected to the p-GaN thin layer on an upper surface of the barrier layer;

providing a control electrode on the p-GaN cap layer, and providing an input electrode and an output electrode on the upper surface of the barrier layer; wherein the control electrode and the p-GaN thin layer are located between the input electrode and the output electrode;

wherein the GaN power device is an enhancement mode GaN high electron mobility transistor (HEMT) device; one electrode of a drain electrode and a source electrode of the enhancement mode GaN HEMT device is configured to correspond to the input electrode, and the other electrode of the source electrode and the drain electrode of the enhancement mode GaN HEMT device is configured to correspond to the output electrode; a gate electrode of the enhancement mode GaN HEMT device is configured to correspond to the control electrode;

the p-GaN thin layer is provided between the gate electrode and the drain electrode; and holes are provided inside the p-GaN thin layer:

in response to that no bias voltage is applied to the gate electrode, no two-dimensional electron gas exists beneath the p-GaN cap layer and the p-GaN thin layer; the p-GaN cap layer and the p-GaN thin layer are configured to deplete the two-dimensional electron gas in the area covered by the p-GaN cap layer and the p-GaN thin layer to make the GaN power device appear in an off state without external bias voltage; and in response to that a bias voltage is applied to the gate electrode, two-dimensional electron gas exists beneath the barrier layer beneath the p-GaN cap layer and the p-GaN thin layer.

8. The method according to claim 7, wherein the etching the p-GaN epitaxial layer to form the p-GaN thin layer and the p-GaN cap layer connected to the p-GaN thin layer on the upper surface of the barrier layer comprises:

determining a target number of the p-GaN cap layer and/or state parameters of the p-GaN thin layer according to device design requirements; wherein the state parameters comprise shape and thickness; and etching the p-GaN epitaxial layer according to the target number of the p-GaN cap layer and/or the state parameters of the p-GaN thin layer to form the p-GaN cap layers with the target number and spaced apart from each other on the upper surface of the barrier layer, and/or, to form the p-GaN thin layer corresponding to the state parameters; wherein the p-GaN cap layer near one end of the output electrode is connected to the p-GaN thin layer.

9. The method according to claim 7, wherein after the providing the control electrode on the p-GaN cap layer, and providing the input electrode and the output electrode on the upper surface of the barrier layer, the method further comprises:

connecting the p-GaN thin layer to a drain electrode through a metal electrode to form a schottky contact between the metal electrode and the p-GaN thin layer.

* * * * *